United States Patent
Ishikawa et al.

(10) Patent No.: US 9,529,163 B2
(45) Date of Patent: Dec. 27, 2016

(54) OPTICAL WIRING SUBSTRATE, MANUFACTURING METHOD OF OPTICAL WIRING SUBSTRATE AND OPTICAL MODULE

(71) Applicant: Hitachi Metals, Ltd., Tokyo (JP)

(72) Inventors: Hiroshi Ishikawa, Hitachi (JP); Kouki Hirano, Hitachinaka (JP); Hiroki Yasuda, Mito (JP)

(73) Assignee: Hitachi Metals, Ltd., Tokyo (JP)

( * ) Notice: Subject to any disclaimer, the term of this patent is extended or adjusted under 35 U.S.C. 154(b) by 274 days.

(21) Appl. No.: 14/200,297

(22) Filed: Mar. 7, 2014

(65) Prior Publication Data

US 2016/0139349 A1  May 19, 2016

(30) Foreign Application Priority Data

May 7, 2013 (JP) ................... 2013-097753

(51) Int. Cl.
| | |
|---|---|
| G02B 6/12 | (2006.01) |
| G02B 6/42 | (2006.01) |
| H05K 3/06 | (2006.01) |
| H05K 3/00 | (2006.01) |

(52) U.S. Cl.
CPC ........... G02B 6/4214 (2013.01); G02B 6/4283 (2013.01); H05K 3/0026 (2013.01); H05K 3/06 (2013.01)

(58) Field of Classification Search
CPC ... G02B 6/4214; G02B 6/4283; H05K 3/0026; H05K 3/06
USPC .............. 385/14–15, 24, 31, 47, 49
See application file for complete search history.

(56) References Cited

U.S. PATENT DOCUMENTS

| | | | | |
|---|---|---|---|---|
| 5,071,213 A | * | 12/1991 | Chan ........................ | G02B 6/42 385/38 |
| 6,112,002 A | * | 8/2000 | Tabuchi ............... | G02B 6/4249 385/124 |
| 6,257,772 B1 | * | 7/2001 | Nakanishi ............ | G02B 6/4212 257/432 |
| 6,567,590 B1 | * | 5/2003 | Okada ................ | H01S 5/02252 385/14 |

(Continued)

FOREIGN PATENT DOCUMENTS

| | | |
|---|---|---|
| JP | 06265740 A | 9/1994 |
| JP | 2004080962 A | 3/2004 |

(Continued)

OTHER PUBLICATIONS

Japanese Office Action for corresponding Japanese Patent Application No. 2013-085287 dated May 24, 2016 and English translation thereof.

(Continued)

*Primary Examiner* — Ryan Lepisto
*Assistant Examiner* — Guy Anderson
(74) *Attorney, Agent, or Firm* — Roberts Mlotkowski Safran Cole & Calderon, PC (57) ABSTRACT

An optical wiring substrate includes an insulation layer including a resin, a first conductor layer formed on the insulation layer and including a metal, the first conductor layer including an inclined surface that is inclined relative to an optical axis of an optical fiber. The insulation layer further includes an end surface that faces a cladding of the optical fiber. The inclined surface of the first conductor layer is formed at a position that faces a core of the optical fiber.

8 Claims, 6 Drawing Sheets

(56) References Cited

U.S. PATENT DOCUMENTS

| | | | |
|---|---|---|---|
| 6,932,519 B2* | 8/2005 | Steinberg | G02B 6/421 385/88 |
| 6,947,645 B2* | 9/2005 | Korenaga | G02B 6/42 385/47 |
| 7,045,920 B2 | 5/2006 | Ohuchi et al. | |
| 7,254,300 B2* | 8/2007 | Nishie | G02B 6/423 385/49 |
| 8,045,829 B2* | 10/2011 | Hayashi | G02B 6/138 156/247 |
| 8,106,550 B2 | 1/2012 | Muramoto | |
| 8,757,897 B2* | 6/2014 | Kosenko | G02B 6/4214 216/13 |
| 8,909,005 B2* | 12/2014 | Satoh | G02B 6/4214 385/14 |
| 9,151,915 B2* | 10/2015 | Castagna | G02B 6/4214 |
| 2002/0131727 A1* | 9/2002 | Reedy | G02B 6/4214 385/88 |
| 2004/0066103 A1 | 4/2004 | Ohuchi et al. | |
| 2005/0196095 A1 | 9/2005 | Karashima et al. | |
| 2010/0133934 A1 | 6/2010 | Muramoto | |
| 2010/0151614 A1 | 6/2010 | Darbinyan et al. | |
| 2013/0004118 A1* | 1/2013 | Castagna | G02B 6/4214 385/14 |
| 2013/0064499 A1 | 3/2013 | Satoh et al. | |
| 2013/0177281 A1* | 7/2013 | Kosenko | G02B 6/4214 385/89 |
| 2013/0264899 A1 | 10/2013 | Goto et al. | |

FOREIGN PATENT DOCUMENTS

| | | |
|---|---|---|
| JP | 2008122756 A | 5/2008 |
| JP | 2010130803 A | 6/2010 |
| JP | 2011095294 A | 5/2011 |
| JP | 2011259654 A | 12/2011 |
| WO | 2012090295 A1 | 7/2012 |

OTHER PUBLICATIONS

Japanese Office Action for corresponding Japanese Patent Application No. 2013-097753 dated Apr. 19, 2016 and English translation thereof.

Chinese Office Action for corresponding Chinese Patent Application No. 201410058614.5 dated Jul. 20, 2016 and English translation thereof.

* cited by examiner

OPTICAL WIRING SUBSTRATE, MANUFACTURING METHOD OF OPTICAL WIRING SUBSTRATE AND OPTICAL MODULE

The present application is based on Japanese patent application No. 2013-097753 filed on May 7, 2013, the entire contents of which are incorporated herein by reference.

BACKGROUND OF THE INVENTION

1. Field of the Invention

This invention relates to an optical wiring substrate configured to accommodate an optical fiber therein, a manufacturing method of the optical wiring substrate and an optical module using the optical wiring substrate.

2. Description of the Related Art

Conventionally, for example, for the purpose of increasing communication speed between information processing devices or the like, an optical communication is becoming widespread, the optical communication being configured such that an optical fiber is used as a signal transmission medium, electric signals are converted to optical signals in the transmitting side of signals and optical signals are converted to electric signals in the receiving side of signals, thereby the communication is carried out. The present applicant has proposed a photoelectric conversion module disclosed in JP-A-2013-076987, the photoelectric conversion module being configured to carry out conversion between electric signals and optical signals.

The photoelectric conversion module disclosed in JP-A-2013-076987 includes a substrate (or optical wiring substrate) and an photoelectric conversion element that is optically connected to an optical fiber. In the front surface of the substrate, a conductor pattern that includes an electrode pattern in which the photoelectric conversion element is mounted and a regulation pattern configured to regulate the position of the optical fiber is formed.

In addition, in the conductor pattern, a reflecting surface configured to optically connect the photoelectric conversion element and the optical fiber is formed. The reflecting surface is formed by moving a blade along the substrate while rotating the blade so as to cut the end part of the conductor pattern, the blade having a tapered blade surface on which an abrasive grain layer is formed. A light emitted from the optical fiber is reflected by the reflecting surface toward the photoelectric conversion element so as to enter the photoelectric conversion element.

SUMMARY OF THE INVENTION

The photoelectric conversion module disclosed in JP-A-2013-076987 is configured such that the reflecting surface is formed in the end surface of the conductor pattern, thus it is needed that as the optical fiber comprised of a core through which a light propagates and a cladding surrounding the outside of the core, an optical fiber configured to have at least the core having a diameter facing the reflecting surface is used. Namely, in order to reflect the light emitted from the end surface of the core and make the light efficiently enter the photoelectric conversion element, as explained in paragraph 0022 of the specification of JP-A-2013-076987 referring to FIG. 3, it is necessary that when the diameter of the optical fiber is represented by D, the diameter of the core is represented by d and the thickness of the conductor pattern is represented by $T_1$, a relationship represented by $T_1 > (D+d)/2$ is satisfied.

On the other hand, if the conductor pattern is thickened, it becomes difficult to accurately form the fine wiring patterns by etching, thus there are restrictions on thickening the thickness ($T_1$) of the conductor pattern. For this reason, as the optical fiber, it is necessary that an optical fiber configured to have a diameter that is equal to or smaller than the thickness of the conductor pattern is used, thus there is a problem that the optical fiber itself is increased in cost, and difficulty in handling is increased in association with a decrease in strength of the optical fiber.

It is an object of the invention to provide an optical wiring substrate that is capable of being reduced in thickness without requiring the optical fiber reduced in diameter, as well as a manufacturing method of the optical wiring substrate and an optical module using the optical wiring substrate.

According to one embodiment of the invention, an optical wiring substrate comprises:

an insulation layer comprising a resin;

a first conductor layer formed on the insulation layer and comprising a metal, the first conductor layer comprising an inclined surface that is inclined relative to an optical axis of an optical fiber, wherein the insulation layer further comprises an end surface that faces a cladding of the optical fiber, and wherein the inclined surface of the first conductor layer is formed at a position that faces a core of the optical fiber.

According to another embodiment of the invention, an optical module comprises:

the optical wiring substrate as defined above; and a photoelectric conversion element mounted on the optical wiring substrate.

According to another embodiment of the invention, a manufacturing method of the optical wiring substrate as defined above comprises:

forming the first conductor layer on a front surface of the insulation layer;

removing a part of the first conductor layer so as to form a wiring pattern;

forming the inclined surface in the first conductor layer; and removing a part of the insulation layer so as to form the end surface.

Effects of the Invention

According to one embodiment of the invention, an optical wiring substrate can be provided that is capable of being reduced in thickness without requiring the optical fiber reduced in diameter, as well as a manufacturing method of the optical wiring substrate and an optical module using the optical wiring substrate.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment

Figure 1:
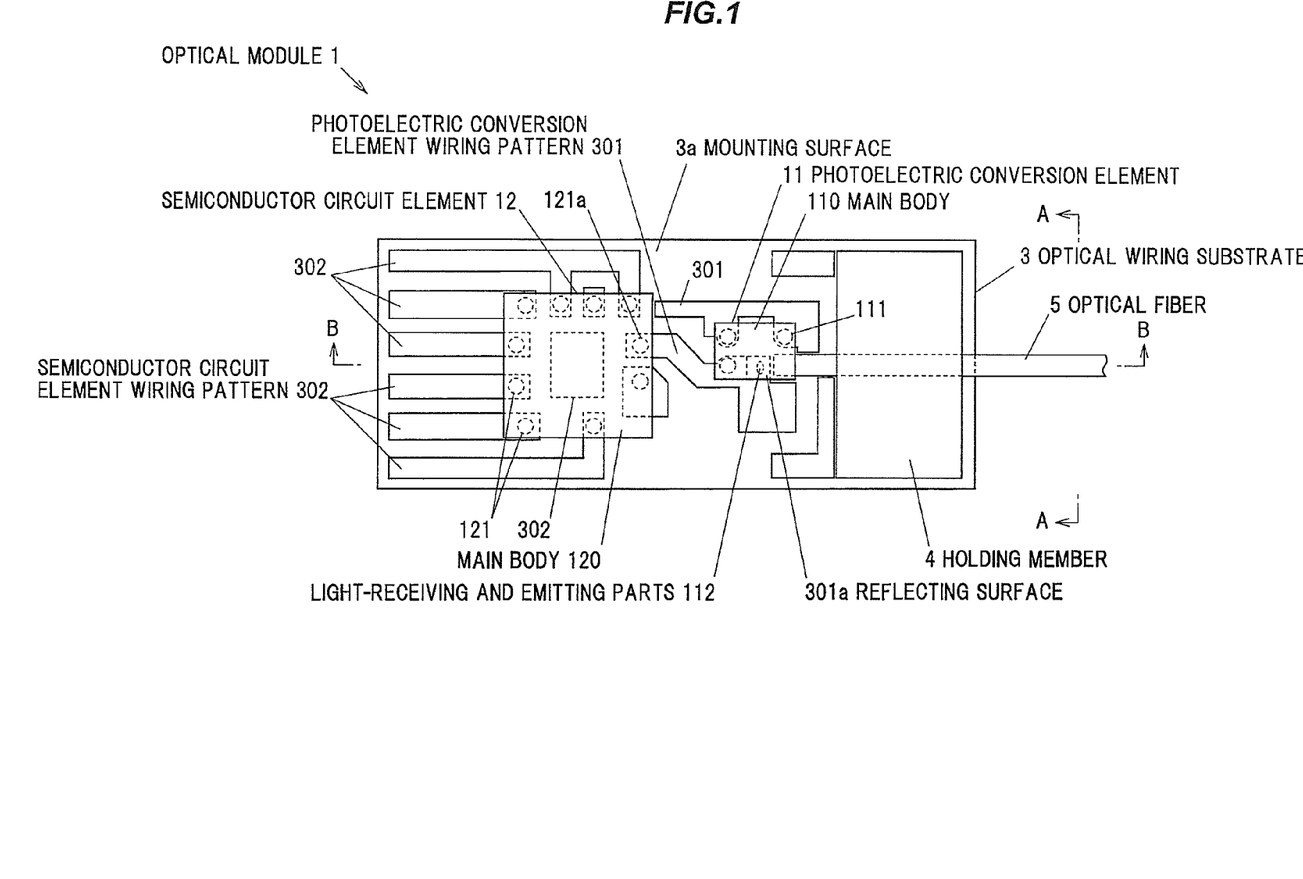
FIG. 1 is a plan view schematically showing a configuration example of an optical wiring substrate and an optical module including the optical wiring substrate according to a first embodiment of the invention.

FIG. 1 is a plan view schematically showing a configuration example of an optical wiring substrate and an optical module including the optical wiring substrate according to a first embodiment of the invention.

(Configuration of Optical Module 1)

The optical module 1 includes an optical wiring substrate 3, a photoelectric conversion element 11 mounted on a mounting surface 3a of the optical wiring substrate 3 by flip-chip mounting and a semiconductor circuit element 12 electrically connected to the photoelectric conversion element 11.

The photoelectric conversion element 11 is configured such that a plurality of (three in the embodiment) pat electrodes 111 are disposed in a main body 110. The plural pad electrodes 111 are electrically connected to a photoelectric conversion element wiring pattern 301 formed in the mounting surface 3a of the optical wiring substrate 3 respectively. The photoelectric conversion element 11 is mounted on a position facing a reflecting surface 301a formed in a part of the photoelectric conversion element wiring pattern 301.

In the embodiment, the photoelectric conversion element 11 is configured such that the dimension in a direction parallel to the longitudinal direction of the optical fiber 5 is, for example, 350 μm, and the dimension in a direction perpendicular to the longitudinal direction of the optical fiber 5 is, for example, 250 μm.

The photoelectric conversion element 11 is an element configured to convert electric signals to optical signals or convert optical signals to electric signals. The former example includes a light emitting element such as a semiconductor laser element, a LED (Light Emitting Diode). In addition, the latter example includes a light receiving element such as a photo diode. The photoelectric conversion element 11 is configured to emit or receive a light from a light-receiving and emitting part 112 formed in the side of the mounting surface 3a of the optical wiring substrate 3 in a direction perpendicular to the optical wiring substrate 3.

The semiconductor circuit element 12 is mounted on the mounting surface 3a of the optical wiring substrate 3 by flip-chip mounting, and is configured such that a plurality (ten in the embodiment) of pad electrodes 121 are disposed in a main body 120. The plural pad electrodes 121 are electrically connected to the semiconductor circuit element wiring pattern 302 formed in the mounting surface 3a of the optical wiring substrate 3 respectively. Of the plural pad electrodes 121, a pad electrode 121a configured to transmit signals is connected to the photoelectric conversion element wiring pattern 301, thereby the semiconductor circuit element 12 and the photoelectric conversion element 11 are electrically connected to each other.

If the photoelectric conversion element 11 is configured to convert electric signals to optical signals, the semiconductor circuit element 12 is a driver IC configured to drive the photoelectric conversion element 11. If the photoelectric conversion element 11 is configured to convert optical signals to electric signals, the semiconductor circuit element 12 is a receiver IC configured to amplify signals input from the photoelectric conversion element 11.

Further, the optical wiring substrate 3 can be configured such that electronic components, other than the photoelectric conversion element 11 and the semiconductor circuit element 12, such as a connector, an IC (Integrated Circuit), or an active element (a transistor and the like), a passive element (a resistor, a condenser and the like) are mounted thereon.

The optical fiber 5 is arranged such that the end surface thereof faces the reflecting surface 301a formed in the photoelectric conversion element wiring pattern 301, and the optical fiber 5 is configured to be held by a holding member 4 from a position above the mounting surface 3a of the optical wiring substrate 3.

(Configuration of Optical Wiring Substrate 3)

Figure 2:
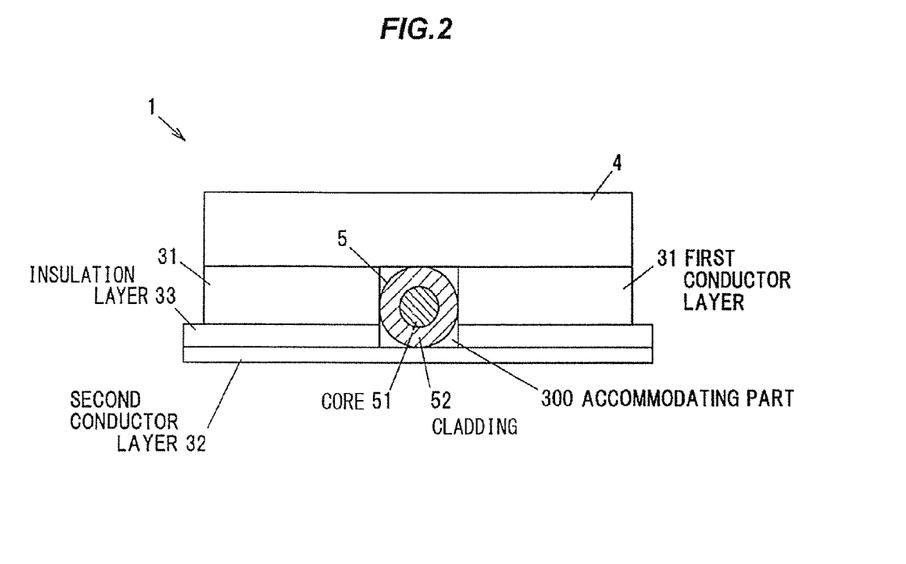
FIG. 2 is a cross-sectional view taken along the line A-A in FIG. 1.
Figure 3A:
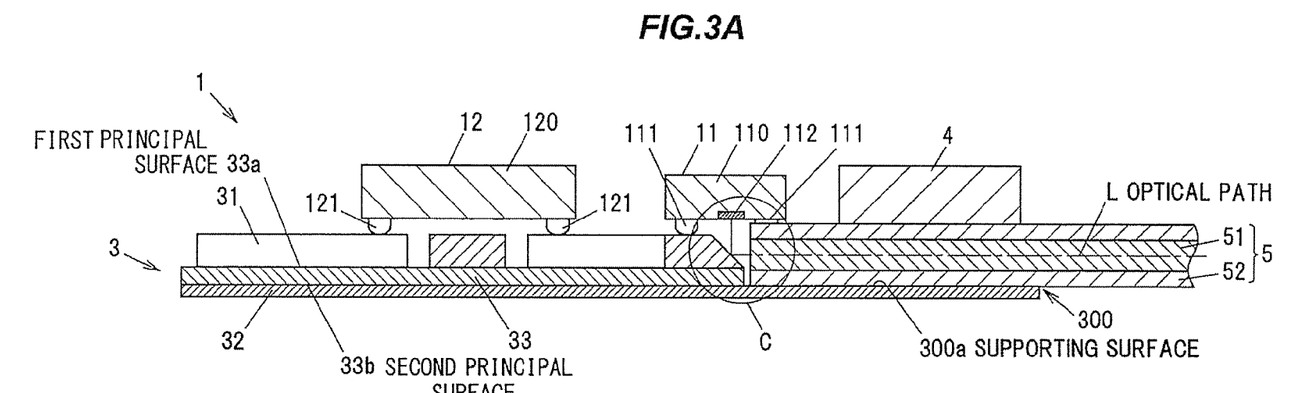
FIG. 3A is a cross-sectional view taken along the line B-B in FIG. 1.
Figure 3B:
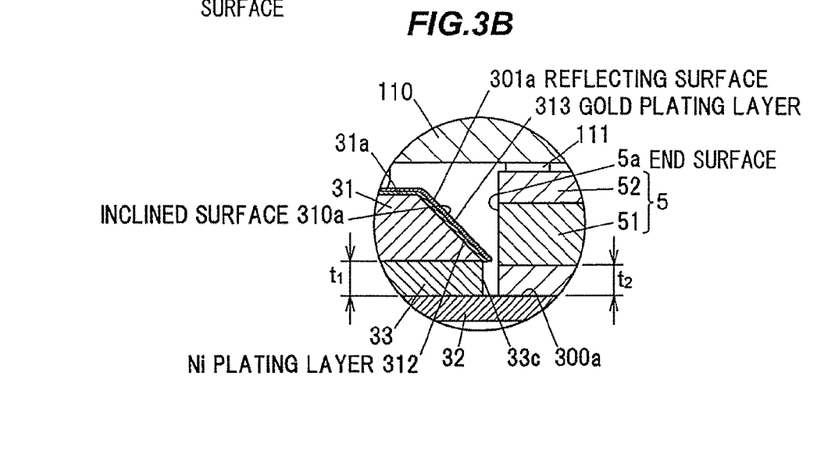
FIG. 3B is a partial enlarged view of C part in FIG. 3A.

FIG. 2 is a cross-sectional view taken along the line A-A in FIG. 1. FIG. 3A is a cross-sectional view taken along the line B-B in FIG. 1, and FIG. 3B is a partial enlarged view of C part in FIG. 3A.

The optical fiber 5 includes the core 51 and the cladding 52. In the embodiment, the optical fiber 5 is configured such that the core 51 has a diameter of, for example, 50 μm, and the cladding has a thickness in a radial direction of, for example, 37.5 μm. Namely, the optical fiber 5 has a diameter (a diameter obtained by summing the core 51 and the cladding 52) of 125 μm.

The optical wiring substrate 3 includes an insulation layer 33 comprised of a resin, a first conductor layer 31 laminated on a first principal surface 33a of the insulation layer 33 and comprised of a metal, the first conductor layer 31 having an inclined surface 310a that is inclined relative to an optical axis of the optical fiber 5, and a second conductor layer 32 as a supporting substrate layer configured to be arranged parallel to the first conductor layer 31 across the insulation layer 33. The insulation layer 33 is interposed between the first conductor layer 31 and the second conductor layer 32, and in the embodiment, insulates between the first conductor layer 31 and the second conductor layer 32.

The first conductor layer 31 is, for example, comprised of a good conductive metal such as copper, and the thickness thereof is, for example, 40 to 80 μm. As shown in FIG. 3B, in the embodiment, on the surface 31a of the first conductor layer 31, a Ni plating layer 312 comprised of nickel (Ni) and a gold plating layer 313 comprised of gold (Au) are laminated. Similarly, with regard to the inclined surface 310a formed in the first conductor layer 31, the Ni plating layer 312 and the gold plating layer 313 are laminated on the surface thereof. The reflecting surface 301a is formed on the outermost surface of the gold plating layer 313.

In the first conductor layer 31, the photoelectric conversion element wiring pattern 301 and the semiconductor circuit element wiring pattern 302 are formed, and in a part of the photoelectric conversion element wiring pattern 301, the inclined surface 310a (the reflecting surface 301a) is formed. The inclined surface 310a (the reflecting surface 301a) is formed in a position facing the core 51 of the optical fiber 5.

As shown in FIG. 3A, when a light is emitted from the optical fiber 5 (the core 51), the reflecting surface 301a reflects the emitted light toward the photoelectric conversion element 11. If the photoelectric conversion element 11 is a light receiving element, the light reflected by the reflecting surface 301a enters the photoelectric conversion element 11 from the light-receiving and emitting part 112 disposed in the main body 110 of the photoelectric conversion element 11, and the photoelectric conversion element 11 converts light signals based on the incident light to electric signals.

In addition, if the photoelectric conversion element 11 is a light emitting element, the photoelectric conversion element 11 converts electric signals output from the semiconductor circuit element 12 to light signals, and emits the light exhibiting the light signals from the light-receiving and emitting part 112. The emitted light is reflected by the reflecting surface 301a toward the end surface 5a of the optical fiber 5 and enters the core 51 so as to propagate through the optical fiber 5. FIG. 3A shows the optical path L that uses the optical fiber 5 as a propagating medium of the light by an alternate long and short dash line.

The insulation layer 33 is comprised of, for example, a resin such as polyimide. As shown in FIG. 3B, the insulation layer 33 is configured such that a dimension $t_1$ thereof in the thickness direction is not less than 0.8 times and not more than 1.2 times relative to a thickness dimension $t_2$ of the cladding 52 of the optical fiber 5 in the diameter direction ($0.8 \times t_1 \le t_2 \le 1.2 \times t_1$). In the embodiment, the thickness of the insulation layer 33 is, for example, 38 µm.

In the optical wiring substrate 3, the accommodating part 300 configured to extend along the longitudinal direction of the optical fiber 5 so as to accommodate at least a part of the optical fiber 5 is formed over the whole of the first conductor layer 31 and the insulation layer 33 in the thickness direction. In the insulation layer 33 in one end (end edge) of the accommodating part 300, an end surface 33c facing the cladding 52 of the optical fiber 5 is formed.

The second conductor layer 32 is, for example, comprised of a good conductive metal such as copper, and has a supporting surface 300a configured to support the optical fiber 5 accommodated in the accommodating part 300. More particularly, the accommodating part 300 passes through over the whole of the first conductor layer 31 and the insulation layer 33 in the thickness direction, and a rear surface 32b of the second conductor layer 32 is exposed. Accordingly, the rear surface 32b of the second conductor layer 32 is configured such that a part thereof is formed as the supporting surface 300a of the accommodating part 300. Further, similarly to the first conductor layer 31, wiring patterns can be also formed on the second conductor layer 32.

As shown FIG. 2, the accommodating part 300 is covered by the holding member 4 from a position above the conductor layer 31, and the optical fiber 5 is fixed by an adhesive agent or the like that is filled in the accommodating part 300. In the embodiment, the cladding 52 of the optical fiber 5 is configured such that the peripheral surface thereof is in contact with the inner surface of the accommodating part 300.

(Manufacturing Method of the Optical Wiring Substrate 3)

Next, a manufacturing method of the optical wiring substrate 3 will be explained referring to FIGS. 4A to 4D.

FIGS. 4A to 4D are cross-sectional views schematically showing a forming process in the accommodating part 300 of the optical wiring substrate 3 and the peripheral part thereof.

The manufacturing process of the optical wiring substrate 3 includes a first step of forming the first conductor layer 31 on the first principal surface 33a of the insulation layer 33, and to form the second conductor layer 32 on the second principal surface 33b of the insulation layer 33, a second step of removing a part of the first conductor layer 31 so as to form the wiring patterns (the photoelectric conversion element wiring pattern 301 and the semiconductor circuit element wiring pattern 302), and to form the concave part 311 that becomes the accommodating part 300, a third step of forming the inclined surface 310a in the first conductor layer 31, a fourth step of removing the whole of the insulation layer 33 corresponding to the bottom surface of the concave part 311 in the thickness direction up to the second conductor layer 32, so as to form the accommodating part 300, and to form the end surface 33c that faces the cladding 52 of the optical fiber 5, and a fifth step of laminating the Ni plating layer 312 and the gold plating layer 313 on the first conductor layer 31, the second conductor layer 32 and the inclined surface 310a. Hereinafter, the first to fifth steps will be explained in more detail.

Figure 4A:
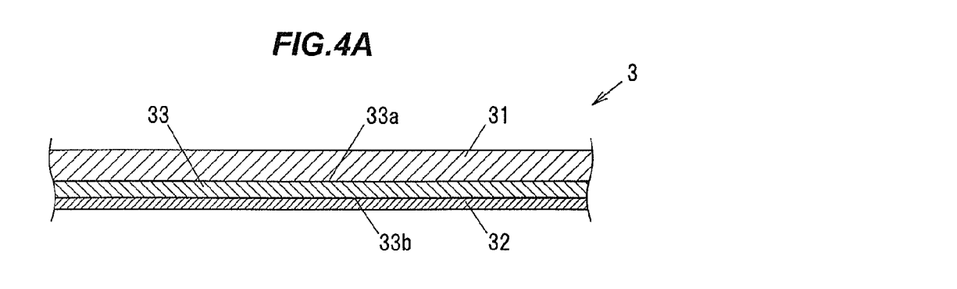
FIGS. 4A to 4D are cross-sectional views schematically showing a forming process in an accommodating part of the optical wiring substrate and the peripheral part thereof.

As shown in FIG. 4A, in the first step, the first conductor layer 31 is formed on the whole of the first principal surface 33a of the insulation layer 33, and the second conductor layer 32 is formed on the whole of the second principal surface 33b of the insulation layer 33, for example, by adhesion, vapor deposition, or electroless plating. In the embodiment, the first conductor layer 31 and the second conductor layer 32 are comprised of copper (Cu) as a main component that has a good electrical conductivity.

Figure 4B:
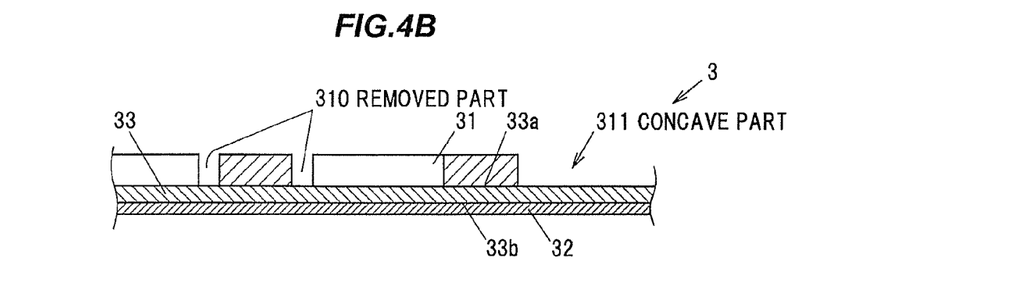

As shown in FIG. 4B, in the second step, a part of the first conductor layer 31 is removed by etching so as to form the photoelectric conversion element wiring pattern 301 and the semiconductor circuit element wiring pattern 302, and to form the concave part 311 that becomes the accommodating part 300. In more particular, the second step includes a step of coating regions of the first conductor layer 31 except for parts corresponding to the removed part 310 and the concave part 311 with a resist, and a step of dissolving the parts of the first conductor layer 31 which are not coated with the resist by etching. Thereby the first conductor layer 31 corresponding to the photoelectric conversion element wiring pattern 301 and the semiconductor circuit element wiring pattern 302 is dissolved so as to leave only the first conductor layer 31 corresponding to the photoelectric conversion element wiring pattern 301 and the semiconductor circuit element wiring pattern 302 and the concave part 311.

Further, in the step, similarly to the first conductor layer 31, a part of the second conductor layer 32 may be removed by etching so as to form wiring patterns in the second conductor layer 32.

Figure 4C:
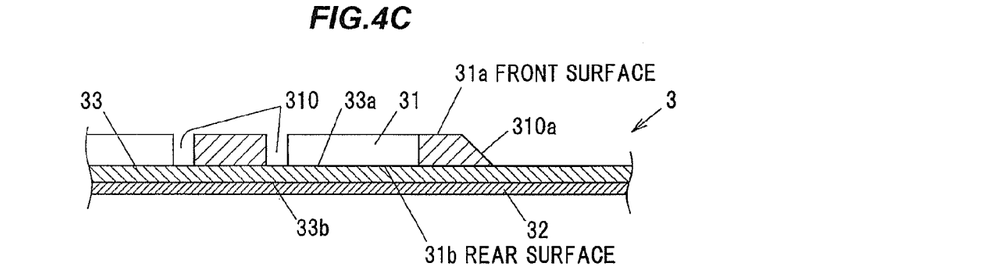

As shown in FIG. 4C, in the third step, the first conductor layer 31 is cut obliquely from the front surface 31a to rear surface 31b of the first conductor layer 31, thereby the inclined surface 310a is formed.

Figure 4D:
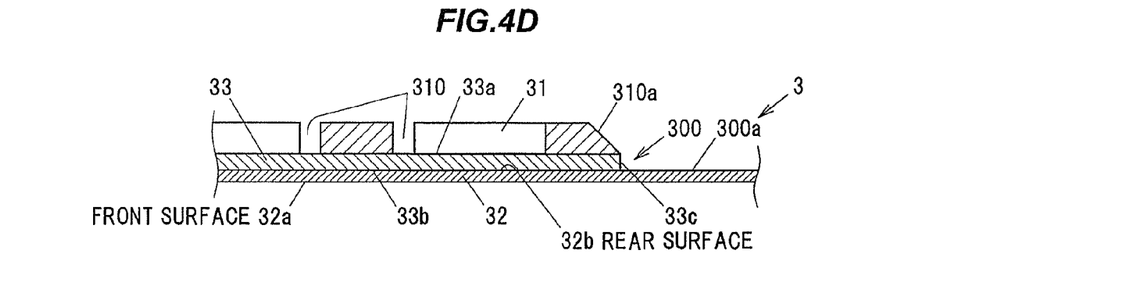

As shown in FIG. 4D, in the fourth step, a laser light is irradiated from a perpendicular direction to the first principal surface 33a of the insulation layer 33 corresponding to the bottom surface of the concave part 311. As the laser light, more particularly, for example, an excimer laser or an UV laser (ultraviolet laser) can be used. By the irradiation of the laser light, the accommodating part 300 that accommodates the optical fiber 5 is formed, and the end surface 33c in the end edge of the accommodating part 300 is formed in the insulation layer 33. The intensity of the laser light is an intensity that the insulation layer 33 can be cut but the second conductor layer 32 cannot be cut by the irradiation of the light. Accordingly, a part of the rear surface 32b of the second conductor layer 32 that remains without being removed by the irradiation of the laser light is formed as the supporting surface 300a of the accommodating part 300. In the embodiment, the end surface 33c is formed to be perpendicular to the supporting surface 300a of the accommodating part 300 (the rear surface 32b of the second conductor layer 32), and functions as a positioning part when the optical fiber 5 is inserted into the accommodating part 300.

In the fifth step, platings of nickel (Ni), gold (Au) and the like are applied to the front surface 31a of the first conductor layer 31, the inclined surface 310a and the front surface 32a of the second conductor layer 32 so as to form the Ni plating layer 312 and the gold plating layer 313. The nickel (Ni) plating, the gold (Au) plating and the like can be carried out by, for example, electroless plating. The reflecting surface 301a is formed on the outermost surface of the gold plating layer 313.

Operation and Advantage of the First Embodiment

According to the above-mentioned first embodiment, the following operation and advantage can be obtained.

(1) The optical wiring substrate 3 is configured such that the end surface 33c facing the cladding 52 of the optical fiber 5 is formed in insulation layer 33, and the reflecting surface 301a of the first conductor layer 31 is formed at a position facing the core 51 of the optical fiber 5, thus it is not necessary for the diameter of the optical fiber 5 to be adapted to the thickness of the first conductor layer 31. Namely, the optical fiber 5 is configured such that a part thereof including the cladding 52 is accommodated in the accommodating part 300 formed by removing at least a part of the insulation layer 33 in the thickness direction, and the first conductor layer 31 having the reflecting surface 301a is laminated on the insulation layer 33, thus even if the thickness of the first conductor layer 31 is thinner than the diameter of the core 51 and the thickness of the cladding 52, the reflecting surface 301a can be configured to face the end surface 5a of the core 51. Thereby, the thickness of the first conductor layer 31 can be reduced without selecting the optical fiber 5 having finer diameter.

(2) In the optical wiring substrate 3, the accommodating part 300 configured to extend along the longitudinal direction of the optical fiber 5 so as to accommodate at least a part of the optical fiber 5 is formed over the whole of the first conductor layer 31 and the insulation layer 33 in the thickness direction, and in the insulation layer 33 in one end (end edge) of the accommodating part 300 in the longitudinal direction, the end surface 33c is formed, thus by utilizing the thickness of the insulation layer 33, a part of the optical fiber 5 facing the first conductor layer 31 can be reduced in size. Accordingly, the optical module 1 is capable of being reduced in thickness.

(3) The optical wiring substrate 3 is configured such that the first conductor layer 31 is laminated on the first principal surface 33a of the insulation layer 33 and the second conductor layer 32 is laminated on the second principal surface 33b of the insulation layer 33, thus the wiring patterns can be formed on both surfaces (the front surface and the rear surface) of the optical wiring substrate 3, so that the arrangement of wiring can be easily carried out.

Second Embodiment

Next, the second embodiment according to the invention will be explained referring to FIGS. 5A, 5B and FIGS. 6A to 6D. The optical wiring substrate 3A according to the embodiment includes the insulation layer 33A and the first conductor layer 31, but does not include the second conductor layer 32 different from the configuration of the optical wiring substrate 3 according to the first embodiment. In FIGS. 5A, 5B and FIGS. 6A to 6D, with regard to components having the same structure and function as those explained for the optical wiring substrate 3 used in the first embodiment, the same reference numerals will be used therefor, and the overlapped explanation will be omitted.

Figure 5A:
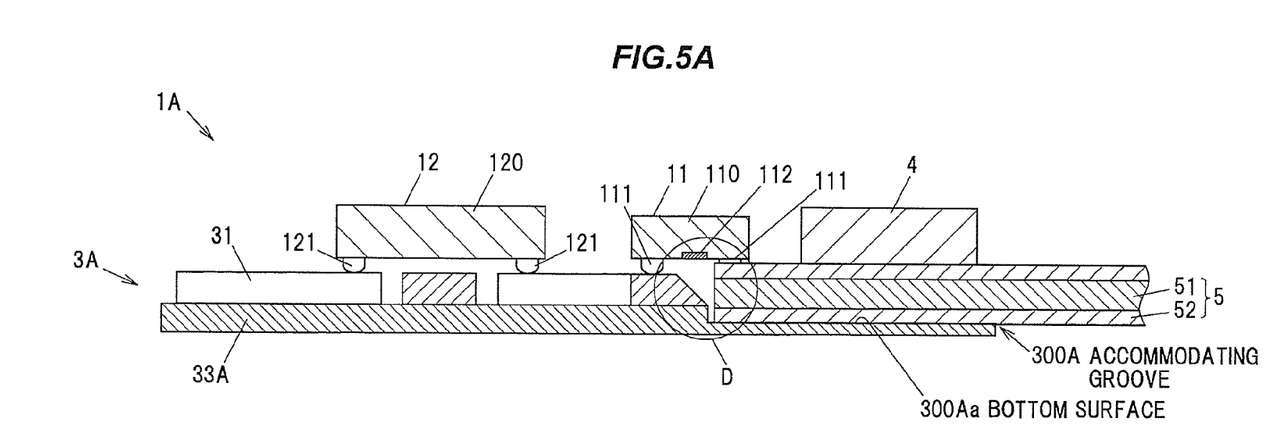
FIG. 5A is a cross-sectional view schematically showing a configuration example of an optical wiring substrate and an optical module including the optical wiring substrate according to a second embodiment of the invention.
Figure 5B:
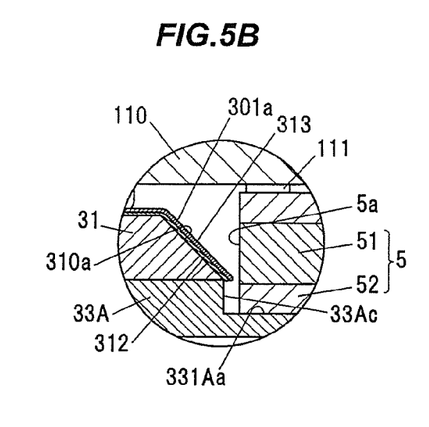
FIG. 5B is a partial enlarged view of D part in FIG. 5A.

FIG. 5A is a cross-sectional view schematically showing a configuration example of the optical wiring substrate 3A and the optical module 1A including the optical wiring substrate 3A according to the second embodiment of the invention, and FIG. 5B is a partial enlarged view of D part in FIG. 5A.

In the insulation layer 33A of the optical wiring substrate 3A according to the embodiment, an accommodating groove 300A is formed along the longitudinal direction of the optical fiber 5, the accommodating groove 300A being configured to accommodate at least a part of the optical fiber 5, and the optical fiber 5 is supported by the bottom surface 300Aa of the accommodating groove 300A. Namely, the insulation layer 33A is configured not to pass through over the whole thereof in the thickness direction in a part corresponding to the accommodating groove 300A, and a part thereof remains as the bottom surface 300Aa. In one end part (end edge) of the accommodating groove 300A in the longitudinal direction, the end surface 33Ac is formed to be perpendicular to the bottom surface 300Aa. The end surface 33Ac is formed at a position that faces the cladding 52 of the optical fiber 5 accommodated in the accommodating groove 300A. The inclined surface 310a formed in the first conductor layer 31 is configured to face the core 51 of the optical fiber 5.

FIGS. 6A to 6D are cross-sectional views schematically showing a forming process in the accommodating groove 300A of the optical wiring substrate 3A and the peripheral part thereof.

The manufacturing process of the optical wiring substrate 3A according to the embodiment includes a first step of forming the first conductor layer 31 on the first principal surface 33Aa of the insulation layer 33A, a second step of removing a part of the first conductor layer 31 so as to form the wiring patterns (the photoelectric conversion element wiring pattern 301 and the semiconductor circuit element wiring pattern 302), and forming the concave part 311 that becomes the accommodating groove 300A, a third step of forming the inclined surface 310a in the first conductor layer 31, a fourth step of removing the insulation layer 33A corresponding to the bottom surface of the concave part 311, so as to form the accommodating groove 300A configured to accommodate the optical fiber 5, and to form the end surface 33c that faces the cladding 52 of the optical fiber 5 in the one end (the end edge) of the accommodating groove 300A, and the fifth step of laminating the Ni plating layer 312 and the gold plating layer 313 on the first conductor layer 31, the second conductor layer 32 and the inclined surface 310a. Hereinafter, the first to fifth steps will be explained in more detail.

Figure 6A:
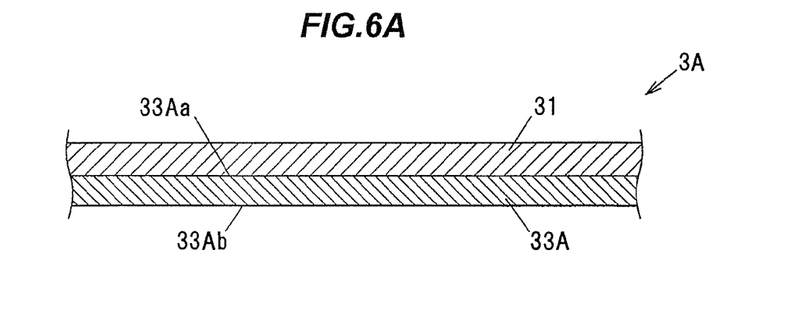
FIGS. 6A to 6D are cross-sectional views schematically showing a forming process in an accommodating groove of the optical wiring substrate and the peripheral part thereof.

As shown in FIG. 6A, in the first step of the embodiment, the first conductor layer 31 is formed on the whole surface of the first principal surface 33Aa of the insulation layer 33A, for example, by adhesion, vapor deposition, or electroless plating. Similarly to the first embodiment, in the embodiment, the first conductor layer 31 is also comprised of copper (Cu) as a main component that has a good electrical conductivity.

Figure 6B:
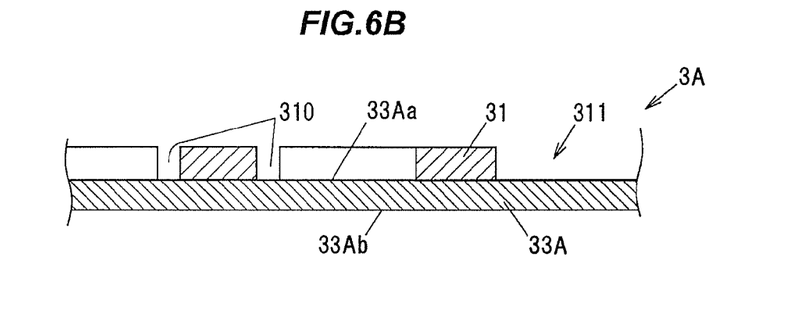

As shown in FIG. 6B, in the second step, a part of the first conductor layer 31 is removed by etching so as to form the photoelectric conversion element wiring pattern 301 and the semiconductor circuit element wiring pattern 302, and to form the concave part 311 that becomes the accommodating groove 300A. Similarly to the second step of the first embodiment, regions except for a part corresponding to the removed part 310 of the first conductor layer 31 and a part corresponding to the concave part 311 are coated with a resist, and parts of the first conductor layer 31 which are not coated with the resist are dissolved by etching. Thereby, the first conductor layer 31 corresponding to the removed part 310 and the concave part 311 is dissolved so as to leave only the first conductor layer 31 corresponding to the photoelectric conversion element wiring pattern 301, the semiconductor circuit element wiring pattern 302 and the concave part 311.

Figure 6C:
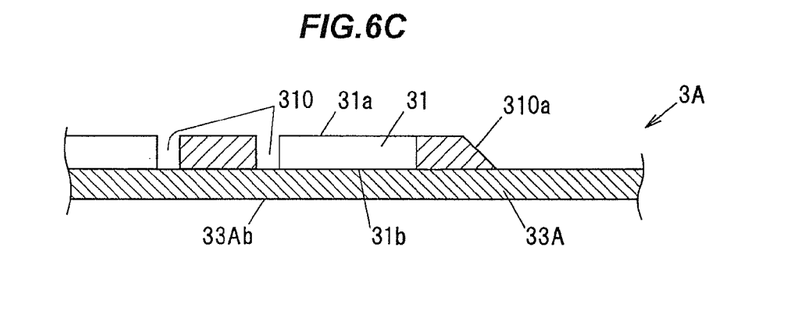

As shown in FIG. 6C, in the third step, similarly to the third step of the first embodiment, the first conductor layer 31 is cut obliquely from the front surface 31a to rear surface 31b of the first conductor layer 61, thereby the inclined surface 310a is formed.

Figure 6D:
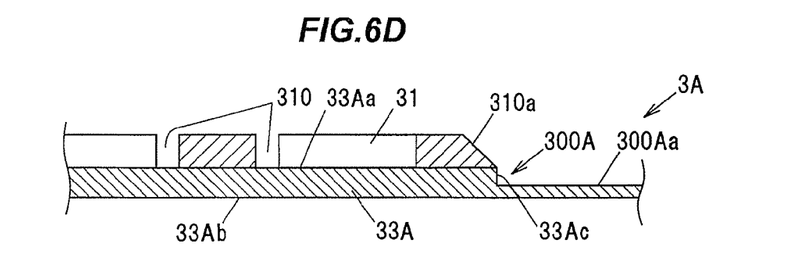

As shown in FIG. 6D, in the fourth step, a laser light is irradiated from a perpendicular direction to the first principal surface 33Aa of the insulation layer 33A corresponding to the bottom surface of the concave part 311. By the irradiation of the laser light, the accommodating groove 300A that accommodates the optical fiber 5 is formed, and the end surface 63c in the end edge of the accommodating part 600 and the end surface 33Ac are formed in the insulation layer 33A. The intensity of the laser light is an intensity that a part of the insulation layer 33A in the thickness direction can be cut, but the whole of the insulation layer 33A in the thickness direction is not cut by the irradiation of the light. Accordingly, in the insulation layer 33A, a part of the insulation layer 33A that remains without being removed by the irradiation of the laser light is formed as the bottom surface 300Aa of the accommodating groove 300A.

Further, in the embodiment, similarly to the first embodiment, the second conductor layer 32 can be laminated on the rear surface 33Ab of the insulation layer 33A so as to form the wiring patterns.

Operation and Advantage of the Second Embodiment

In the above-mentioned second embodiment, the same operation and advantage as those described in the items (1) to (3) of the first embodiment can be also obtained.

Summary of the Embodiments

Next, the technical idea grasped from the above-explained embodiments will be described by utilizing the reference numerals and the like in the embodiments. However, the respective reference numerals and the like in the following description do not limit the constitutional components in the scope of the claim to the members concretely shown in the embodiments.

[1] An optical wiring substrate (3, 3A), comprising an insulation layer (33, 33A) comprised of a resin, a first conductor layer (31) laminated on the insulation layer (33, 33A) and comprised of a metal, the first conductor layer (31) having an inclined surface (310a) that is inclined relative to an optical axis (5) of an optical fiber, wherein the insulation layer (33, 33A) has an end surface (33c, 33Ac) that faces a cladding (52) of the optical fiber (5), and the inclined surface (310a) of the first conductor layer (31) is formed at a position that faces a core (51) of the optical fiber (5).

[2] The optical wiring substrate (3) according to [1], wherein an accommodating part (300) configured to extend along the longitudinal direction of the optical fiber (5) so as to accommodate at least a part of the optical fiber (5) is formed over the whole of the first conductor layer (31) and the insulation layer (33) in the thickness direction, a supporting substrate layer (the second conductor layer 32) configured to have a supporting surface (300a) for supporting the optical fiber (5) that is accommodated in the accommodating part (300), and to be arranged parallel to the first conductor layer (31) across the insulation layer (33) is further comprised, and the end surface (33c, 33Ac) is formed in one end of the accommodating part (300) in the longitudinal direction.

[3] The optical wiring substrate (3) according to [1] or [2], wherein the insulation layer (33) is configured such that a dimension thereof in the thickness direction is not less than 0.8 times and not more than 1.2 times relative to a thickness dimension of the cladding (52) of the optical fiber (5) in the diameter direction.

[4] The optical wiring substrate (3) according to [2] or [3], wherein the supporting substrate layer is the second conductor layer (32) comprised of a metal.

[5] The optical wiring substrate (3A) according to [1], wherein the insulation layer 33A has an accommodating groove (300A) formed therein along the longitudinal direction of the optical fiber (5), the accommodating groove (300A) being configured to accommodate at least a part of the optical fiber (5), and the optical fiber (5) is supported by the bottom surface (300Aa) of the accommodating groove (300A).

[6] An optical module (1), comprising the optical wiring substrate (3, 3A) according to any one of [1] to [5], and the photoelectric conversion element (11) mounted on the optical wiring substrate (3, 3A).

[7] A manufacturing method of the optical wiring substrate (3, 3A) according to [1], comprising forming the first conductor layer (31) on the front surface (33a, 33Aa) of the insulation layer 33A, removing a part of the first conductor layer (31) so as to form the wiring patterns (the photoelectric conversion element wiring pattern 301 and the semiconductor circuit element wiring pattern 302), forming the inclined surface (310a) in the first conductor layer (31), and removing a part of the insulation layer (33) so as to form the end surface (33c, 33Ac).

[8] A manufacturing method of the optical wiring substrate (3) according to any one of [2] to [4], comprising forming the first conductor layer (31) on the front surface (33a) of the insulation layer (33), and forming the supporting substrate layer (the second conductor layer 32) in the rear surface (33b) of the insulation layer (33), removing a part of the first conductor layer (31) so as to form the wiring patterns (the photoelectric conversion element wiring pattern 301 and the semiconductor circuit element wiring pattern 302), and forming a concave part (311) that becomes the accommodating part (300), forming the inclined surface (310a) in the first conductor layer (31), and removing the whole of the insulation layer (33) corresponding to the bottom surface of the concave part (311) in the thickness direction up to the supporting substrate layer, so as to form the accommodating part (300), and to form the end surface (33c) that faces the cladding (52) of the optical fiber (5).

[9] The manufacturing method of the optical wiring substrate (3A) according to [5] comprising forming the first conductor layer (31) on the front surface (33Aa) of the insulation layer (33A), removing a part of the first conductor layer (33A) so as to form the wiring patterns (the photoelectric conversion element wiring pattern 301 and the semiconductor circuit element wiring pattern 302), and forming a concave part (311) that becomes the accommodating groove (300A), forming the inclined surface (310a) in the first conductor layer (31), and removing the insulation layer (33A) corresponding to the bottom surface of the concave part (311), so as to form the accommodating groove (300A), and to form the end surface (33Ac) that faces the cladding (52) of the optical fiber (5) in the one end of the accommodating groove (300A).

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, in the above-mentioned embodiments, a configuration that one optical module 1 are mounted on the optical wiring substrate 3 has been explained, but not limited to this, a plurality of accommodating parts 300, a plurality of accommodating grooves 300A and a plurality of optical module structures may be mounted on the optical wiring substrate 3.

In addition, in the above-mentioned embodiment, a configuration that the first conductor layer 31 and the second conductor layer 32 are comprised of copper (Cu) has been explained, but not limited to this, a part or the whole of the first conductor layer 31 and the second conductor layer 32 may be comprised of, for example, aluminum (Al). Also, materials of the plating layers are not limited to the above-mentioned materials. Materials of the insulation layer 33, 33A are not limited to polyimide, but, for example, polyethylene terephthalate (PET) may be also used.

In addition, in the above-mentioned embodiment, the accommodating part 300, the accommodating groove 300A and the end surface 33c, 33Ac are formed by irradiating the laser light perpendicular to the insulation layer 33, 33A, but not limited to this, those may be formed by a shadow mask configured such that the transmitted light is adjusted or a mechanical processing such as dicing. In case of the mechanical processing, the accommodating part 300, the accommodating groove 300A and the end surface 33c, 33Ac can be formed at lower cost than the processing by the laser light.

In addition, in the above-mentioned first embodiment, the second conductor layer 32 is used as the supporting substrate layer, but not limited to this, instead of the second conductor layer 32, for example, a plate-like member comprised of an insulation material of resins may be used as the supporting substrate layer.

What is claimed is:

1. An optical wiring substrate, comprising:
    an insulation layer comprising a resin;
    a first conductor layer formed on one side of the insulation layer and comprising a metal, the first conductor layer comprising an inclined surface that is inclined relative to an optical axis of an optical fiber,
    a second conductor layer formed on an opposite side of the insulation layer and comprising a metal, the second conductor layer supporting the optical fiber,
    wherein the insulation layer further comprises an end surface that faces a cladding of the optical fiber, and
    wherein the inclined surface of the first conductor layer is formed at a position that faces a core of the optical fiber.

2. The optical wiring substrate according to claim 1, further comprising:
    an accommodating part configured to extend along a longitudinal direction of the optical fiber so as to accommodate at least a part of the optical fiber, the accommodating part being formed over a whole of the first conductor layer and the insulation layer in a thickness direction thereof; and
    the second conductor layer comprising a supporting surface for supporting the optical fiber that is accommodated in the accommodating part and arranged parallel to the first conductor layer across the insulation layer,
    wherein the end surface is formed at one end of the accommodating part in the longitudinal direction.

3. The optical wiring substrate according to claim 1, wherein the insulation layer is configured such that a dimension thereof in the thickness direction is not less than 0.8 times and not more than 1.2 times relative to a thickness dimension of the cladding of the optical fiber in the diameter direction.

4. The optical wiring substrate according to claim 1, wherein the insulation layer further comprises an accommodating groove formed therein along the longitudinal direction of the optical fiber so as to accommodate at least a part of the optical fiber, and wherein the optical fiber is supported by a bottom surface of the accommodating groove.

5. An optical module, comprising:
    the optical wiring substrate according to claim 1; and
    a photoelectric conversion element mounted on the optical wiring substrate.

6. A manufacturing method of the optical wiring substrate according to claim 1, comprising:
    forming the first conductor layer on a front surface of the insulation layer;
    removing a part of the first conductor layer so as to form a wiring pattern;
    forming the inclined surface in the first conductor layer; and
    removing a part of the insulation layer so as to form the end surface.

7. A manufacturing method of the optical wiring substrate according to claim 2, comprising:
    forming the first conductor layer on a front surface of the insulation layer, and forming the second conductor layer in a rear surface of the insulation layer;
    removing a part of the first conductor layer so as to form a wiring pattern and a concave part as the accommodating part;
    forming the inclined surface in the first conductor layer; and
    removing the whole of the insulation layer corresponding to a bottom surface of the concave part in the thickness direction up to the second conductor layer, so as to form the accommodating part, and to form the end surface that faces the cladding of the optical fiber.

8. The manufacturing method of the optical wiring substrate according to claim 4, comprising:

forming the first conductor layer on a front surface of the insulation layer;

removing a part of the first conductor layer so as to form a wiring pattern and a concave part as the accommodating groove;

forming the inclined surface in the first conductor layer; and removing the insulation layer corresponding to a bottom surface of the concave part, so as to form the accommodating groove, and to form the end surface that faces the cladding of the optical fiber at one end of the accommodating groove.

\* \* \* \* \*